(12) United States Patent
Perner et al.

(10) Patent No.: US 6,728,799 B1
(45) Date of Patent: Apr. 27, 2004

(54) HYBRID DATA I/O FOR MEMORY APPLICATIONS

(75) Inventors: Frederick A. Perner, Palo Alto, CA (US); Kenneth J. Eldredge, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/483,383

(22) Filed: Jan. 13, 2000

(51) Int. Cl.[7] .............................................. G06F 13/14
(52) U.S. Cl. ........................... 710/52; 710/36; 371/22.3
(58) Field of Search ................... 710/52, 36; 371/22.31

(56) References Cited

U.S. PATENT DOCUMENTS

| | | | |
|---|---|---|---|
| 4,856,002 A | * 8/1989 | Sakashita et al. | 371/21 |
| 4,894,800 A | * 1/1990 | Hudson, Jr. | 371/22.2 |
| 5,163,024 A | 11/1992 | Heilveil et al. | 365/219 |
| 5,347,523 A | * 9/1994 | Khatri et al. | 371/22.3 |
| 5,699,506 A | * 12/1997 | Phillips et al. | 395/183.13 |
| 5,717,702 A | * 2/1998 | Stokes et al. | 371/22.35 |
| 5,875,197 A | * 2/1999 | Connell | 371/22.31 |

FOREIGN PATENT DOCUMENTS

| | | | |
|---|---|---|---|
| EP | 0162234 | 7/1981 | G11C/8/00 |
| EP | 0363031 A1 | 9/1989 | G11C/19/28 |
| EP | 0743649 A2 | 4/1996 | G11C/7/00 |

* cited by examiner

Primary Examiner—Abdelmoniem Elamin

(57) ABSTRACT

Some forms of memory data I/O requires a parallel interface with the memory array and a serial interface with external data ports to the memory. A hybrid decoder/scan register data I/O scheme is described that offers a high speed data access to selected points along a set of scan registers that connect to the columns (bit lines) of a memory array. The interface to the memory array is a long register which comprises a chain of scan register blocks. Data to and from the memory array is transferred in a parallel manner. Data I/O to a specific memory address or memory data block is routed from a serial data I/O line, through a set of switches controlled by a decoder circuit to the input (or output) port of one of the scan register blocks. This hybrid data I/O circuit offers a high speed access to selected points within the column circuits of a memory array while maintaining an efficient and high speed serial output offered by a scan chain data register.

10 Claims, 5 Drawing Sheets

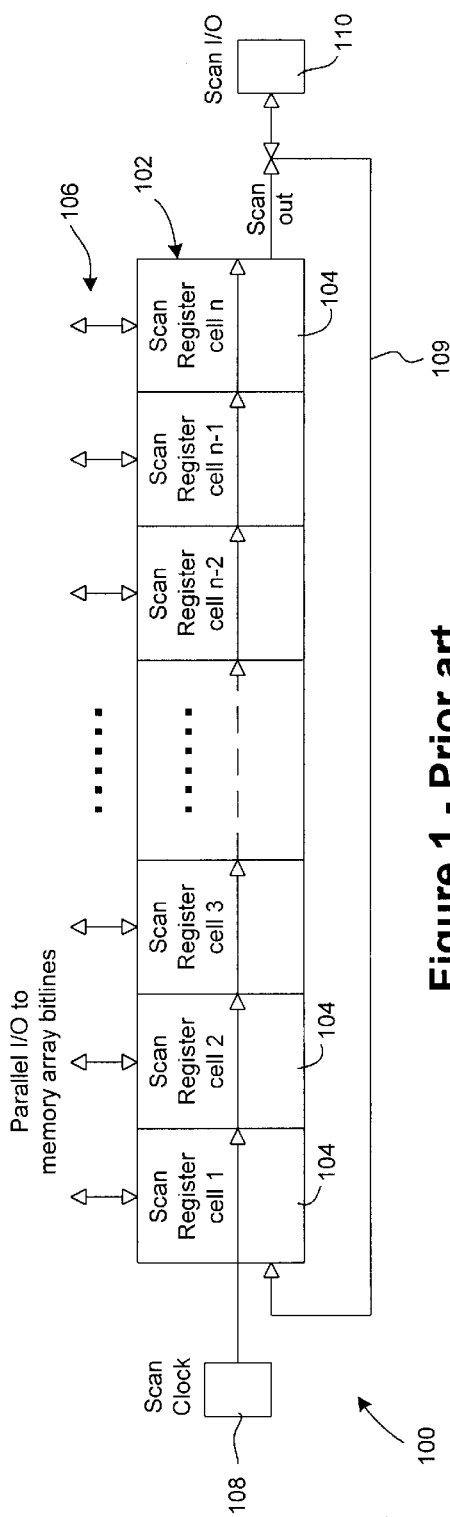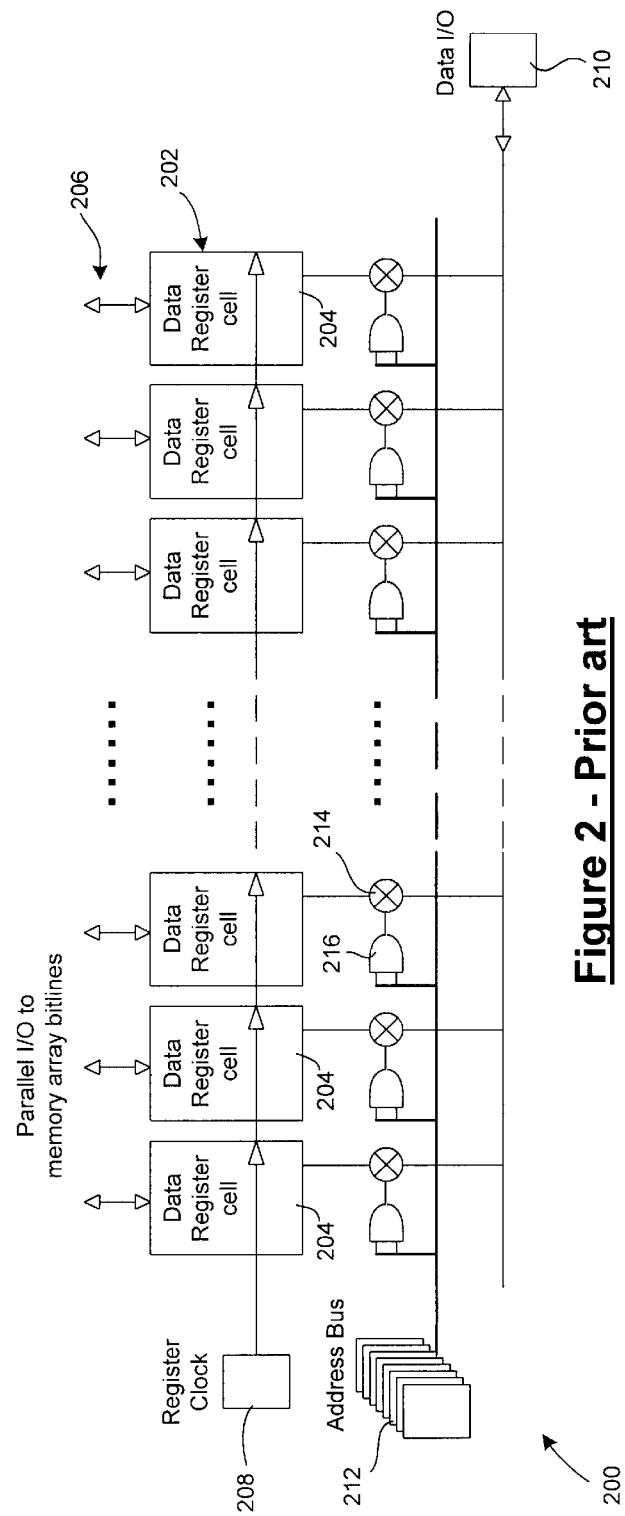

HYBRID DATA I/O FOR MEMORY APPLICATIONS

FIELD OF THE INVENTION

The present invention relates to the field of memory circuits, and in particular to a hybrid decoder and scan data I/O scheme for memory circuits.

BACKGROUND OF THE INVENTION

In order to extract data from a digital memory array, for example, often a wide data register is provided, coupled between the memory array and the input/output (I/O) port. The wide data register may comprise a series of cells with the individual cells coupled to respective bitlines of the array. Then, a selected row of data from the array can be transferred to the data register, and selected data from that row can be transferred from the corresponding register cells to the I/O port. Two methods have been used in the past to extract the selected data from the wide data register, one based on address decoding and the other based on scan shifting of the data register.

In the address decoding method, a connection is made to each register cell with a decoder to select and transfer the data stored in the selected data register cell(s) to a data bus. This scheme has the advantages of fast and random access to data in the register. The disadvantages are that each register cell requires a decoder and transfer device, and that an address bus (true and compliment) must be routed to each of the register cells. In a memory circuit in which integrated circuit space is important, the relatively large circuit area which is required by the decoding/transfer circuits and bus can be particularly disadvantageous.

The scan shifting method for wide data register access requires that the register cells be configured into a scan chain. Then, the data in the register is serially shifted into or out of the register at the rate set by the scan clock. The advantages of this method are simple I/O and clocking (2 wires, data I/O and scan clock), high speed burst rate (data I/O moves at the scan clock rate), and simple physical layout. However, this method has the disadvantage that a long latency may be involved in serially shifting data through the register until the data of interest exits the chain of scan register cells. The latency depends upon where the data of interest is positioned in the shift register relative to the I/O port.

SUMMARY OF THE INVENTION

In accordance with the principles of the present invention, there is provided a data input/output circuit which has a data register circuit and an I/O control circuit. The data register circuit comprises a sequence of shift register blocks. Each shift register block has at least one register cell, a data shift input, a data shift output and a shift clock input. The data shift inputs and outputs of the shift register blocks are coupled to pass data through the register circuit in sequence according to signals at the shift clock input. The couplings between data shift inputs and outputs form data access nodes. The I/O control circuit includes a plurality of transmission gate circuits coupling the respective data access nodes to a data input/output port. The I/O control circuit also includes selection circuitry coupled to the transmission gate circuits for selecting one of the transmission gate circuits on the basis of input from an address bus, so as to enable data to pass between the data register circuit and the input/output port through the selected transmission gate.

The data register circuit preferably includes a parallel data input/output path, for reading data from and/or writing data to the register cells of the data register circuit. In one form of the invention, the parallel data input/output path is coupled to a memory array, such that respective bitlines of the memory array are coupled to respective register cells of the data register circuit.

Each shift register block preferably comprises a plurality of register cells coupled in a chain to enable shifting of data therein through the plurality of cells from a first register cell having the data shift input to a second register cell having the data shift output. In the preferred form of the invention, each of the shift register blocks has an equal number of register cells.

In accordance with the present invention, there is also provided a method for data transfer which involves a data register having a chain of shift registers. Each of the shift registers has at least one register cell, a data shift input, a data shift output and a shift clock input. The data shift inputs and outputs of the shift registers are coupled to pass data through the data register according to signals at the shift clock input. The couplings between data shift inputs and outputs of the shift registers form data access nodes. In the data transfer method, one of the data access nodes is selected according to input on an address bus. Then, data is transferred into or out of the data register through the selected data access node by shifting data in the data register using the shift clock input.

Preferably, the data transfer method includes parallel input or output of data to or from the register cells of the data register. The parallel data transfer may be between the data register and a memory array, for example. The data can be transferred in parallel fashion between the data register and a memory array by coupling respective register cells to respective bitlines of the memory array. Magnetic random access memory (MRAM) circuits are particularly well suited to the characteristics of the data input/output circuit and method of the present invention, in view of the very small memory cell size, for example, which makes possible large memory arrays with consequently large I/O data registers.

To provide output transfer of data from a memory array, for example, selected data is provided by parallel input to the data register from an external data source, and at least a portion of the selected data is serially output through the selected data access node by shifting data in the data register using the shift clock input.

To provide input transfer of data to a memory array, for example, selected data is serially input to the data register through the selected data access node by shifting data in the data register using said shift clock input, and the selected data is then transferred by parallel output from the data register to the memory array.

Embodiments of this invention provide a solution to the serial I/O latency problem associated with scan chain shift registers while maintaining character of the serial I/O and high burst data rates offered by scan shift registers.

BRIEF DESCRIPTION OF THE DRAWINGS

The invention is described in greater detail hereinafter, by way of example only, through description of a preferred embodiment thereof and with reference to the accompanying drawings in which:

FIG. 1 is a block diagram of a prior art "n" bit data register with a scan I/O;

FIG. 2 is a block diagram of a prior art "n" bit data register with decoder I/O;

DETAILED DESCRIPTION OF THE PREFERRED EMBODIMENT

Figure 3:
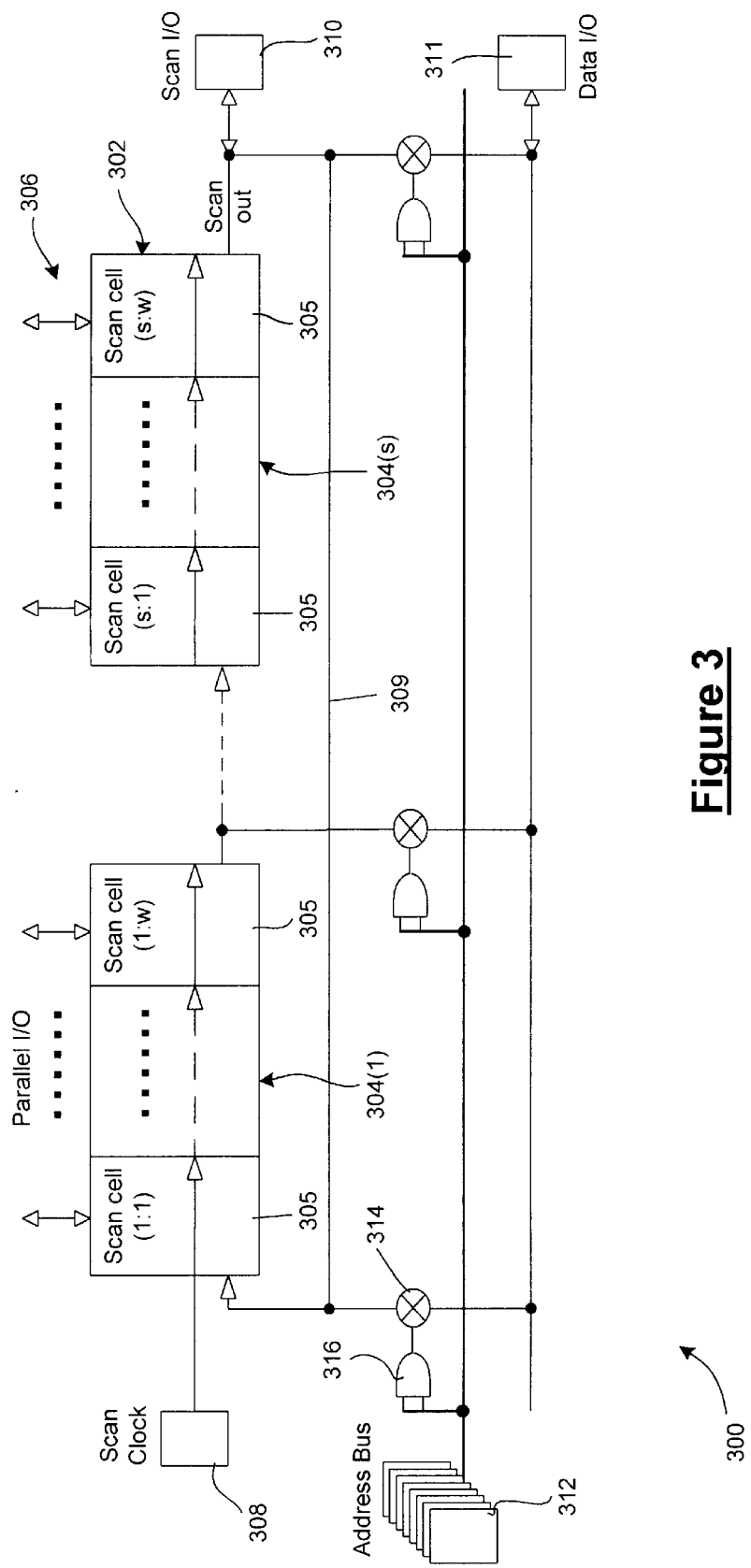
FIG. 3 is a block diagram of a hybrid "n" bit data register in accordance with an embodiment of the present invention.

A method and apparatus for input/output access to a digital memory array is disclosed herein. In the following description, for purposes of explanation, specific nomenclature and specific implementation details are set forth to provide a thorough understanding of the present invention. However, it will be apparent to one skilled in the art that these specific details are not required in order to practice the present invention. For example, data registers, shift register blocks and memory arrays of certain dimensions are referred to in the detailed description to provide context and comparative results, but it will be recognized by those skilled in the art that data registers, shift register arrays and memory arrays of other dimensions, larger and smaller, can also be applied to the principles of the present invention.

In the following description, where "data" is referred to it will be appreciated that such "data" may be represented in various ways depending upon the context. For example, "data" in a memory array or register cell might be represented by a voltage level or magnetic state, for example, whilst on a bus or during transmission such "data" might be in the form of an electrical current or electromagnetic signal.

One of the prior art approaches to memory data I/O can be referred to as a "scan register" architecture, an example of which is shown in block diagram form in FIG. 1. The illustrated scan register architecture 100 has a scan register 102 which comprises a series of n scan register cells 104 coupled to serially shift data from one cell to the next (from cell 1 through to cell n, left to right as shown in FIG. 1) according to a clocking signal provided by a scan clock 108. Data from cell n can be output to a scan I/O port 110, and can also be returned to scan cell 1 through a feedback connection 109. The feedback connection 109 also allows data which is input at the scan I/O port 110 to be input to the scan register 102. The scan register 102 thus has a serial connection to the scan I/O port for both input and output of data. The scan register is also coupled for parallel data transfer with the memory array (not shown in FIG. 1). This is accomplished by coupling bitlines from the memory array to respective cells 104 of the scan register, as indicated at 106 in the Figure. In this way, a row of data from the memory array can be transferred between the memory array and scan register by selecting the row in the memory array and transferring data in parallel fashion through the bitline connections 106 to/from the scan register from/to the memory array.

In the scan register architecture, data stored in specific scan register location (cell) is shifted through the series of scan register cells, one location per scan clock cycle until the desired data appears at the scan out port of the last scan register cell (cell n) in the scan chain. The desired data is then available at the scan I/O port 110.

Features of the scan approach are the following:

1. Scan register circuit configurations are similar to the wide data register configurations found in many applications (memory circuits).

2. The I/O data rate is limited by the data shifts between scan registers in the scan chain and the frequency limit set by the scan clock. Serial I/O data at the scan clock rate is referred to as the 'burst' rate.

3. The physical design of a serial scan circuit is compatible with the physical design of data registers that may be required to read parallel data from and write parallel data to an external circuit (such as a set of bit lines in a memory).

The primary disadvantage of the scan register approach is that the data is only sequentially accessible from the scan data I/O port and it can therefore take many scan clock cycles before the data of interest appears at the scan data output port. The delay in gaining access to data within the scan chain is referred to as 'latency' and may be quite long depending on the length of the scan chain, and the location of the desired data in the data sequence. For example, if the scan chain is 1024 bits wide and a 100 MHz scan clock is used, it will take 10.2 us to output the last bit of data from this data register. The data readout burst rate is set by the scan clock and in this example, data exits the scan chain in 10 ns time intervals. Thus, the scan register approach offers a simple and efficient physical design and a high speed data 'burst' rate at the expense of potentially long data access latency times.

Another approach which has been adopted in the prior art for wide register data I/O involves addressing each register cell with a decoder circuit and directly selecting each register cell to read or write data to or from a data I/O line. An example of such a "decoder I/O" register architecture 200 is shown in block diagram form in FIG. 2. In this Figure, a wide data register 202 comprises a set of register cells 204. The register 202 has a parallel I/O 206 for connection, for example, to a memory array, wherein each register cell can be coupled to a respective bitline of the memory array. Data is clocked into and out of the register 202 using a register clock 208. Each register cell 204 is also coupled through a respective transmission gate 214 to a data I/O port 210. Each transmission gate 214 is controlled by a decoder circuit 216 which is driven from an address bus 212 from a timing control block (not shown).

This form of register data I/O circuit enables high speed access to any data bit in the register. Sequential data access operations are done by supplying a series of addresses from the timing control block to generate a serial data output at the data I/O port 210. The primary feature of the decoder data I/O approach is fast random access to any point in the wide data register. The disadvantages to the decoder data I/O approach include the following:

1) The addition of an address decoder and a transmission gate circuitry to every data register cell circuit.

2) A unique address needs to be supplied for every register cell accessed. Considering a block mode operation where several or many sequential register bits are serially accessed, new address commands must be created for each bit accessed. The set of sequential address commands must be generated in an external timing control circuit and transmitted to the register over the address bus 212.

In summary, the decoder data I/O approach offers a fast random data access. However, it is not well suited for the serial output of block oriented data and the physical design requires a decoder circuit and transmission gate that will not efficiently fit into tight pitch data register circuits (as in memory on-pitch column circuits).

FIG. 3 is a block diagram of a hybrid data I/O circuit 300 constructed in accordance with an embodiment of the present invention. The hybrid data I/O circuit 300 includes a data register 302 which is formed of a series of interconnected scan registers 304. Each of the scan registers 304 comprise a sequence of scan register cells 305 which are coupled together for shifting data from one cell to the next. The scan registers 304 are interconnected to also allow data shifting, so that the last cell of one scan register shifts data to the first cell of the next scan register. The data shifting is controlled by a scan clock 308. Each of the scan cells allows for parallel data input/output (306), to couple to respective bitlines of a memory array or the like, as described hereinabove in connection with the prior art data register architectures. The I/O register architecture of the present invention is particularly suited to the application of magnetic random access memory (MRAM) circuits, which can involve large (e.g. gigabit) memory arrays which might require long data I/O register structures.

Consider a data register that is n units (e.g. bits) wide, where n is relatively large, for example corresponding to the number of memory cells in a row of a memory array. Then, in the hybrid data I/O circuit of the present invention the data register 302 can be formed of s interconnected scan registers 304($l$), . . . , 304($s$), each having w scan register cells 305, where n=s*w (n, s, w all integers). The register cells 305 of each of the scan registers 304 are arranged to shift data from one cell to the next toward cell number w, and cell w of one scan register is coupled to shift its data to cell number 1 of the next scan register. A feedback connection 309 is provided to allow data from cell w of the last scan registers, designated as cell (s:w), to pass to cell number 1 of the first scan register (cell (1:1)). An I/O connection is also provided between the end cells of each of scan registers 304 and a data I/O port 311 by way of a respective transmission gate 314. The transmission gates 314 are controlled by decoding circuitry 316 which is driven from an address bus 312. Additionally, the last scan cell of the last scan register (i.e. cell (s:w)) is coupled to a scan I/O port 310.

Operation of the wide data register I/O circuit is a form of hybrid between the two different data register circuits described hereinabove. The data register 302 is in the form of a shifting data register, with decoded input/output connections to the data I/O port 311 between scan register blocks 304. In order to obtain a selected data element from the data register 302, the appropriate transmission gate 314 is selected using the address bus 312 controlling the decoding circuitry 316 which can be in the form of a 1 of s decoder. Then, with the output of the appropriate scan register block coupled to the data I/O port, data is shifted through the scan blocks 304 of the data register 302 until the required data element appears at the data I/O port. Alternatively, the data in the register 302 may be shifted until the required data is located in the $w^{th}$ cell of the scan block, and then the address for that scan block asserted on the address bus to provided that data to the data I/O 311. For retrieving a block of data from the register 302, the transmission gate output of the scan block containing the first data element in the block is selected through the address bus, and shifting of the data through the register using the scan clock continues with the transmission gate open until the last data element of the block is output.

The hybrid data I/O circuit of the preferred embodiment of the present invention features the fast random data access of the decoder I/O approach and the block oriented, layout efficient, high burst rate of the scan data I/O circuit. This circuit sub-divides the wide data register into sub-blocks which are each randomly selectable with a conventional decoder. An advantage of this approach is an efficient physical design: the data registers are easily designed as scan registers and the block decoder is easily contained within the pitch of several scan register cells that form the register sub-block. A second advantage of this approach is the serial shift of data to the data output port. The number of bits shifted are determined by the number of scan clock pulses supplied to the register which may be more or less than defined by the sub-block boundaries. The timing support circuits need not be as complex as in the decoder data I/O architecture, because a set of addresses for random data access to every bit in block oriented data is not required.

Figure 4:
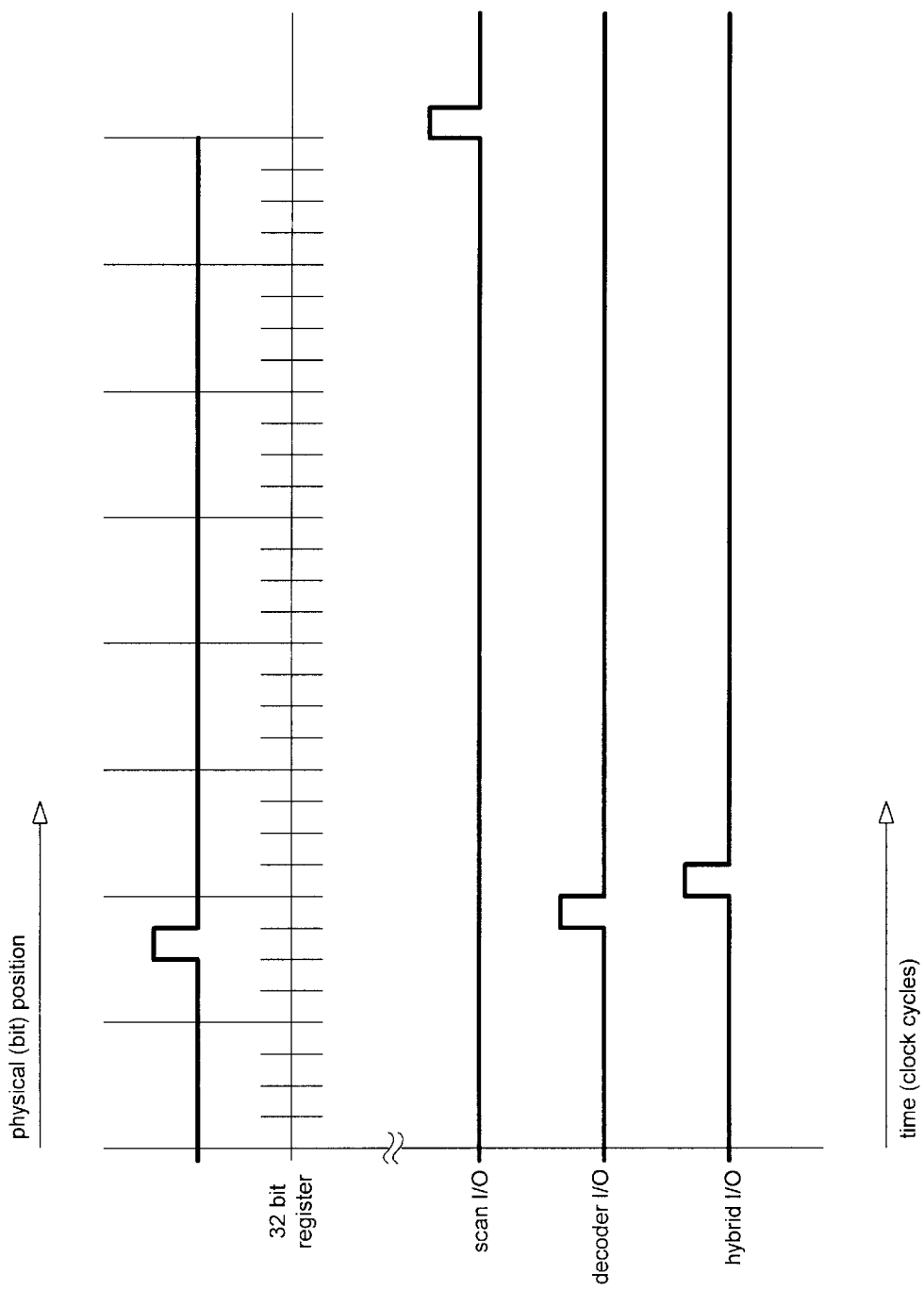
FIG. 4 is a timing diagram comparing access times in an example of a 32 bit data register.

FIG. 4 is a simple timing diagram to demonstrate the timing of the conventional serial and parallel data I/O approaches as compared to the hybrid data I/O approach of the present invention. Consider a wide data register capable of controlling 32 bits of data. If bit #7 was to be accessed, the scan approach would require 25 data shifts before bit #7 would exit the register. In the decoder approach, a 5 bit address is supplied from an external timing control circuit (5 true address lines plus 5 compliment address lines) to a decoder circuit (a 5 input AND gate) to supply a gate signal to a transmission gate to connect the data register #7 to the data I/O signal line. The data access time to bit #7 is limited by the address setup time and the delay associated with the connection of the register to the data I/O line. There may some address switching noise added to the data I/O signal unless the AND gate is controlled by a control signal that will wait until the address is valid before connecting the AND gate to the transmission gate. In the hybrid approach, the address decoder is set up to select one of 8 sub-blocks (3 address lines and 3 compliment address lines plus a 3 input AND gate distributed over the area of 4 data register cells). The access latency of bit #7 is two scan clock cycles. Bit #8 is shifted out with the first scan clock cycle and bit #7 follows with the second scan clock cycle.

Figure 5:
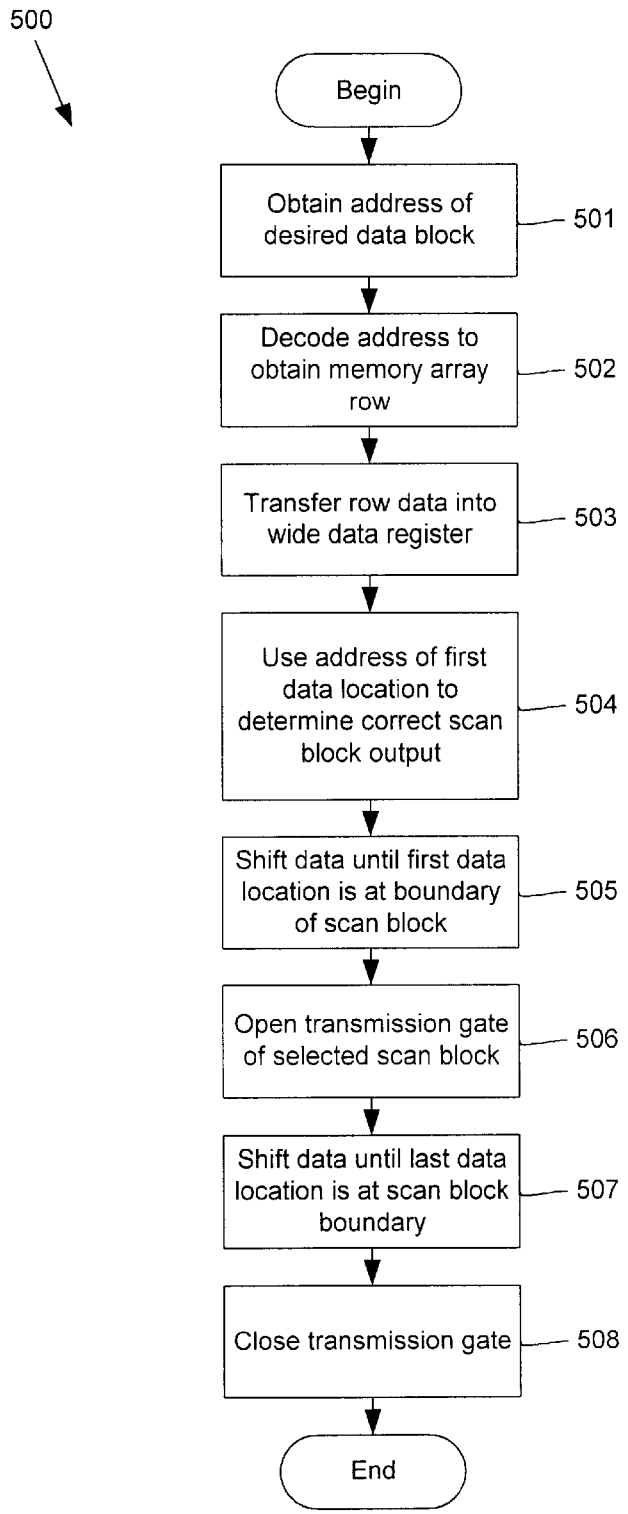
FIG. 5 is a flowchart diagram illustrating a procedure for accessing a block of data utilizing a hybrid data register I/O architecture according to an embodiment of the invention.

A flow diagram 500 is shown in FIG. 5, which illustrates an example of the steps involved in accessing a block of data from a memory array utilizing a hybrid data register I/O architecture according to an embodiment of the present invention. The procedure is described in greater detail hereinbelow with examples based on the above mentioned 32 bit structure having 8 scan register blocks of 4 cells each.

The address of a desired data block is obtained at initial step 501, for example in the form of a start address and an end address or a start address and a block length. For the purposes of simplified explanation, it will be assumed that the desired data block is within a single row of the memory array. The start address is decoded in known fashion to determine which row of the memory array the data block is located in (step 502), and the appropriate row of stored data is transferred from the memory array to the wide data register (step 503). The start address of the data block can then be used to determine which scan register block contains the first data element of the desired data block (step 504). For example, in a 32 bit register structure having 8 scan register blocks of 4 cells each, 5 bits of the start address would identify the first element of the data block within the data register. Of those 5 address bits, the three most-significant-bits could be used to determine which of the 8 scan blocks contains the data block first element. The remaining 2 address bits (e.g. the 2 least-significant-bits of the address) then identifies where the data block first element is within the scan block. In order to position the first element (bit) of the desired data block for output at the data I/O port (see FIG. 3), the data register can be shifted to the boundary of the scan block by shifting the register data by the number of cell positions (scan clock cycles) represented by the remaining (least-significant) bits of the address (or the complement of that binary number to shift to the other scan block boundary). This operation is performed at step 505 in the procedure 500. The transmission gate indicated at step 504 is then opened at step 506 to allow data to pass from the register to the data I/O port (311 in FIG. 3). Shifting of data using the scan clock then continues until the last data location has reached the open transmission gate and output to the data I/O port (step 507). The transmission gate is then closed (step 508) and the data access procedure is complete.

Figure 6:
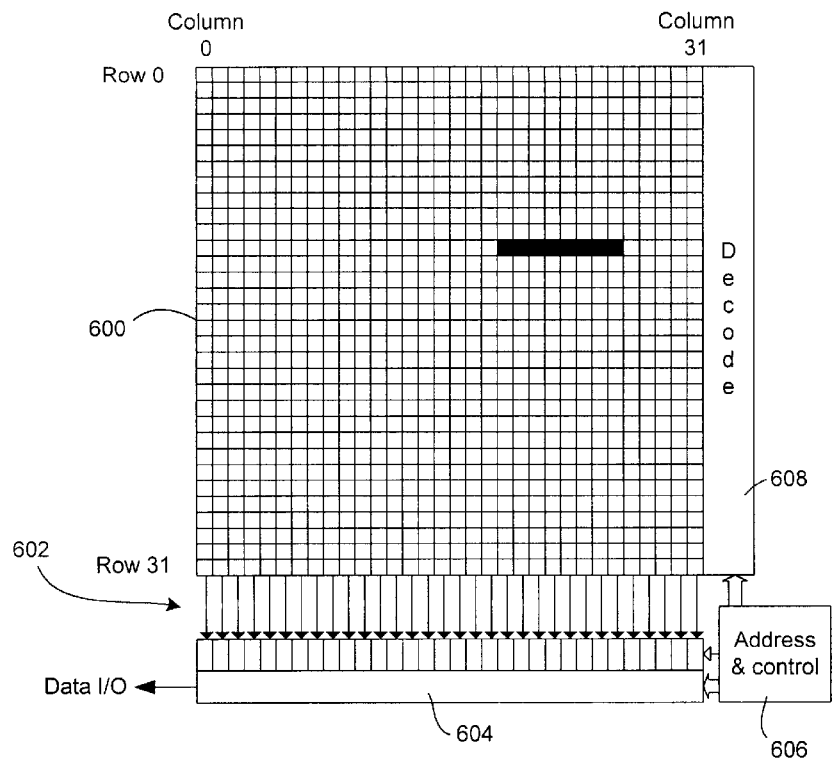
FIG. 6 is a block diagram of a memory array and data I/O register.

An example of the operation of the present invention is further explained hereinbelow with reference to FIGS. 6 and 7 of the accompanying drawings. FIG. 6 is a block diagram which shows an example of a memory array 600 which comprises 32 rows and 32 columns of memory elements. A hybrid data register I/O circuit 604 in accordance with an embodiment of the present invention is coupled to the memory array 600 through parallel data connections 602 to the bitlines of the memory array. The data register circuit includes a plurality of register cells, one for each column of the memory array. As described above, the register cells are arranged into a plurality of scan register blocks which are interconnected to allow shifting of data from one adjacent cell to the next and from one adjacent scan register block to the next. The actual structure of the data register I/O circuit in this example is shown in greater detail in FIG. 7 and described further below. A row select decode circuit 608 is coupled to the memory array 600 to select one row of the 32 rows of memory elements in the array, as controlled by an address and control circuit 606. The data stored in the selected row is then available for transfer to the data register I/O circuit 604.

In the present example, 8 bits of data stored in the memory array are desired to be accessed, as indicated by the shaded blocks in the array illustrated in FIG. 6. The desired data block as shown is 8 bits in length and is positioned at row #11 and at bit (column) #19 to #26. One way of representing the location of this data block would be to provide the starting address and length of the block of data, for example:

start addr.=01011 10011(binary)

length=01000(binary)

In this case the first five bits of the start address represent the row number (11 dec.) and the second five bits represent the bit (column) number of the beginning of the data block (19 dec.). By providing the address to the address and control block 606, the first portion of the address could then be used by the decode circuit 608 to allow the data in row #11 to be copied to the data register I/O circuit 604.

Figure 7:
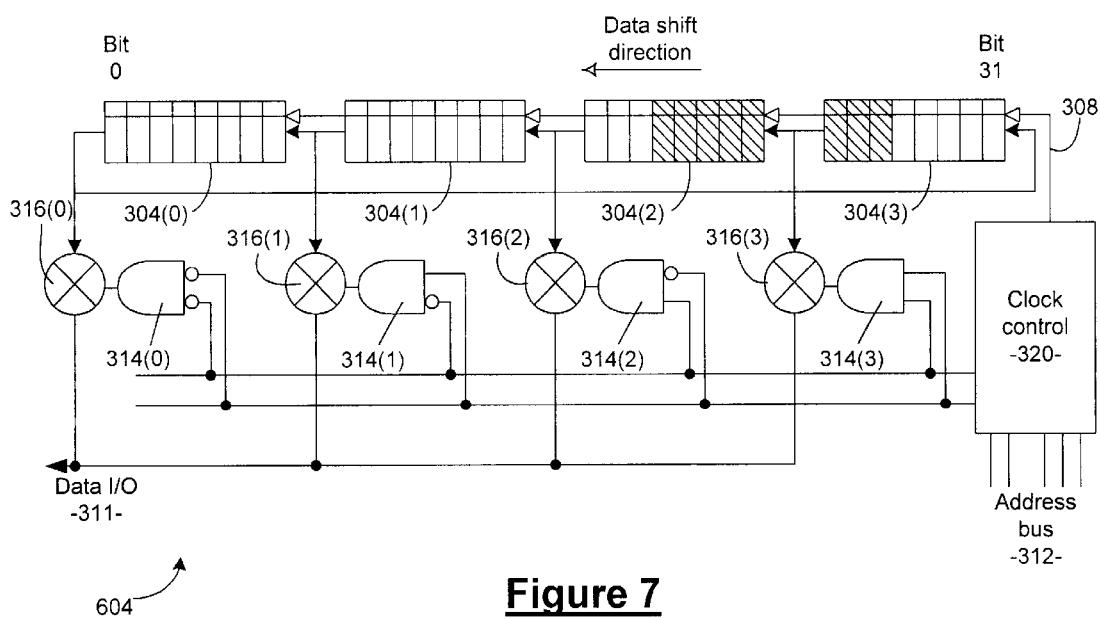
FIG. 7 is a block diagram of an example of a hybrid data register I/O circuit constructed in accordance with the present invention.

FIG. 7 is a block diagram of the data register I/O circuit 604. The circuit 604 includes a series of scan registers blocks 304, which each comprise a sequence of scan register cells. As shown, the circuit 604 has four scan register blocks coupled in sequence: 304(3), 304(2), 304(1) and 304(0). Each of the scan register blocks comprise 8 scan register cells, and operatively receive data from respective 8 columns of the memory array, beginning with block 304(0) which corresponds to columns 0 to 7. The FIG. 7 indicates with a hatched pattern the scan register cells which would contain the desired data from the memory array after the data from row #11 thereof is copied into the register I/O circuit. The output of each of the scan blocks 304 is coupled to the data I/O port 311 by way of a respective transmission gate 316. Each transmission gate is controlled by a respective decoder circuit 314, for example an AND gate.

In order to retrieve the desired data for output at the data I/O port 311, it is first necessary to identify which of the scan register blocks 304 contains the start of the desired data block. This can be achieved using the second portion of the start address referred to above, and in particular the leading two bits thereof The leading two bits of the address are provided from the address bus 312 to the decoder circuits 314, in order to enable the transmission gate 316 which corresponds thereto. In this example, transmission gate 316(2) is activated, because scan register block 304(2) contains the start of the desired data.

Shifting of data through the scan register blocks 304 is accomplished using the scan clock 308 which is provided in this case from a clock control circuit 320. The number of data shift operations (scan clock periods) before the desired data appears at the data I/O port can be determined from the remainder of the start address. The remaining 3 bits of the start address in this case is 011 binary, which indicates three shift operations before the start of the desired data block is available at the data I/O port through transmission gate 316(2). Then, the length parameter dictates the number of further shift operations required to obtain the entire block of the desired data through the selected transmission gate.

The scan clock 308 provided to the scan registers and the inputs to the decoder circuits 314 can be controlled by the clock control circuit 320 and the basis of input received from the address bus 312. For example, as mentioned hereinabove in relation to FIG. 5, it may be desirable to perform the number of shift operations indicated by the lowest order start address bits before providing the higher order start address signals to the decoder circuits 314, so that when the appropriate transmission gate 316 is activated, the next scan clock cycle outputs the first bit of the desired data block to the data I/O port. The clock control circuit can then leave the decoder circuit active for the number of scan clock cycles indicated by the data block length parameter to obtain all of the desired data.

In summary, a high speed hybrid data I/O scheme is disclosed herein that combines the advantages of serial scan registers and decoder random access registers and which is well suited for wide data registers that are found in many memory circuits. The data I/O register architecture of the present invention takes advantage of the efficient physical design of serial scan registers and the block organization of data typically found in wide data registers to provide a fast data I/O circuit that does not have its data access dominated by the latency of serial scan chains. The circuit and area overhead added by combining the decoder approach with the scan approach is small when distributed over the width of several scan register blocks.

The foregoing detailed description of the invention has been presented by way of example only, and it is contemplated that changes and modifications may be made by one of ordinary skill in the art, to the specific and arrangements of elements of the present invention without departing from the scope of the invention. For example, although several specific circuits are illustrated and described in order to provide an understanding of the principles of the invention, the present invention is not limited to those structures. The actual length of the data register may be any desired length, and similarly the size of the scan/shift register blocks and number of scan cells in each can be selected. The size of the scan blocks and number of cells may be selected according to desired performance characteristics, whereby fewer cells per block decreases potential data access latency, but increases the complexity of the required scan block decoding circuitry. It is also possible that each cell can store more than one data bit.

Although the majority of the preceding description of the embodiments of the invention relates to the use of a data I/O register in an output operation to retrieve data from a memory array, it will be appreciated that the data I/O register architecture of the present invention is equally applicable to input operations, for example for storing data in a selected memory array location or group of locations. In that case the data would be fed to the data register (302 in FIG. 3) serially through the data I/O port (311) and a selected one of the transmission gates (314) using the scan clock (308) to shift the data into the register. The parallel I/O (306) would then be used to transfer the data from the register to the memory array.

A number of circuit elements are also described in connection with the preferred embodiments, such as register cells, transmission gates and decoding circuits, and it is not intended that the present invention be limited to the use of the circuit elements precisely as described. It will be readily recognized by those of skill in the art that other circuit elements of equivalent function for the purposes of the invention may be substituted whilst remaining within the scope of the present invention. For example, a transmission gate for use in the present invention may take various forms depending upon various factors such as manufacturing process and the like, but still perform the required function of a controllable switch for coupling the data I/O port (e.g. 311 in FIG. 3) to a selected data access node in the chain of scan/shift registers.

We claim:

1. A data input/output circuit, comprising:
   register circuit comprising a plurality of data registers that form shift register blocks, wherein each data register comprises a plurality of scan cells comprising a data shift input, a data shift output and a shift clock input, and wherein the data shift inputs and outputs of the scan cells are coupled to pass data through the register circuit in sequence according to signals at the shift clock input, the couplings between data registers forming data access nodes; and
   an I/O control circuit having an address bus input, the I/O control circuit including a plurality of transmission gate circuits coupling the respective data access nodes to a data input/output port, the I/O control circuit also including selection circuitry coupled to the transmission gate circuits for selecting one of the transmission gate circuits on the basis of input on the address bus, so as to enable data to pass between the data register circuit and the input/output port through the selected transmission gate and for shifting data through the scan cells until required data appears at the input/output port.

2. A data input/output circuit as claimed in claim 1, wherein the data register circuit includes a parallel data input/output path, for reading data from and/or writing data to the scan cells of the data register circuit.

3. A data input/output circuit as claimed in claim 2, wherein the parallel data input/output path is coupled to a memory array, such that respective bitlines of the memory array are coupled to respective scan cells of the data register circuit.

4. A data input/output circuit as claimed in claim 1, wherein each of the shift register blocks has an equal number of scan cells.

5. A method for data transfer, comprising:
   providing a register circuit having a chain of data registers, wherein each data register has a plurality of scan cells, a data shift input, a data shift output and a shift clock input, and wherein the data shift inputs and outputs of the scan cells are coupled to pass data through the data register according to signals at the shift clock input, the couplings between data shift inputs and outputs forming data access nodes;
   selecting one of the data access nodes on the basis of input on the address bus, so as to enable data to pass between the data register circuit and the input/output port; and
   transferring data into or out of the data register through the selected data access node by shifting data in the data register using said shift clock input.

6. A method as claimed in claim 5, including a step of parallel input or output of data to or from the scan cells of the data register.

7. A method as claimed in claim 6, wherein selected data is provided by parallel input to the data register from an external data source, and at least a portion of the selected data is serially output through the selected data access node by shifting data in the data register using said shift clock input.

8. A method as claimed in claim 6, wherein selected data is serially input to the data register through the selected data access node by shifting data in the data register using said shift clock input, and the selected data is provided by parallel output from the data register.

9. A method as claimed in claim 8, wherein data is transferred in parallel fashion between the data register and a memory array, respective scan cells being arranged to transfer data by respective bitlines of the memory array.

10. A data input/output circuit for a memory array, comprising:
    a data register circuit comprising a sequence of data register blocks, wherein each data register block has a plurality of scan cells, a data shift input, a data shift output and a shift clock input, and wherein the data shift inputs and outputs of the data register blocks are coupled to pass data through the register circuit in sequence according to signals at the shift clock input, the couplings between data shift inputs and outputs forming data access nodes, the data register circuit further including parallel data transfer connections for coupling the register cells to respective bitlines of the memory array; and
    an I/O control circuit having an address bus input, the I/O control circuit including a plurality of transmission gate circuits coupling the respective data access nodes to a data input/output port, the I/O control circuit also including selection circuitry coupled to the transmission gate circuits for selecting one of the transmission gate circuits on the basis of input on the address bus, so as to enable data to pass between the data register circuit and the input/output port through the selected transmission gate and for shifting data through the scan cells until required data appears at the input/output port.

* * * * *